(12) United States Patent
Megawer et al.

(10) Patent No.: US 10,348,310 B1
(45) Date of Patent: Jul. 9, 2019

(54) PROGRAMMABLE DIGITAL SIGMA DELTA MODULATOR

(71) Applicant: Xilinx, Inc., San Jose, CA (US)

(72) Inventors: Karim M. Megawer, Urbana, IL (US); Parag Upadhyaya, Los Gatos, CA (US); Didem Z. Turker Melek, San Jose, CA (US); Zhaoyin D. Wu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/992,646

(22) Filed: May 30, 2018

(51) Int. Cl.
*H03L 7/08* (2006.01)
*H03M 3/00* (2006.01)
*H03L 7/197* (2006.01)

(52) U.S. Cl.
CPC .......... *H03L 7/0805* (2013.01); *H03L 7/1974* (2013.01); *H03M 3/436* (2013.01)

(58) Field of Classification Search
None
See application file for complete search history.

(56) References Cited

U.S. PATENT DOCUMENTS

| | | | |
|---|---|---|---|
| 6,600,788 B1 | 7/2003 | Dick et al. | |
| 6,876,698 B1 | 4/2005 | Dick et al. | |
| 9,559,704 B1 | 1/2017 | Wong et al. | |
| 2004/0207437 A1* | 10/2004 | Shibahara | H03C 3/0925 327/156 |
| 2013/0069696 A1* | 3/2013 | Koerner | H03L 7/1976 327/117 |
| 2016/0248430 A1* | 8/2016 | Waheed | H03L 7/099 |
| 2016/0322979 A1* | 11/2016 | Upadhyaya | H03L 7/18 |

OTHER PUBLICATIONS

Kao, Yao-Huang et al., "A Wide Input-Range EΔ Modulator for Applicatons to Spread-Spectrum Clock Generator," Proc. of the 2006 IEEE Asia Pacific Conference on Circuits and Systems, Dec. 4, 2006, pp. 530-533, IEEE, Piscataway, New Jersey, USA.
El Kholy, Ahmed et al., "A Wide Spreading Range Programmable Spread Spectrum Clock Generator Using a EΔ Fractional-N PLL," Proc. of the 2009 Joint IEEE North-East Workshop on Circuits and Systems and TAISA conference, Jun. 28, 2009, pp. 1-4, IEEE, Piscataway, New Jersey, USA.
El Kholy, Ahmed et al., "Sigma-delta Modulation Techniques for Wide Spreading Range Programmable Spread Spectrum Clock Generators," Proc. of the 2009 4th International Design and Test Workshop, Nov. 15, 2009, pp. 1-5, IEEE, Piscataway, New Jersey, USA.

* cited by examiner

*Primary Examiner* — Howard Williams
(74) *Attorney, Agent, or Firm* — Patterson + Sheridan, LLP

(57) ABSTRACT

An example sigma delta modulator (SDM) circuit includes a floor circuit, a subtractor having a first input coupled an input of the floor circuit and a second input coupled to an output of the floor circuit, and a multi-stage noise shaping (MASH) converter having a programmable order. The MASH converter includes an input coupled to an output of the subtractor. The SDM further includes a programmable delay circuit having an input coupled to the output of the floor circuit, and an adder having a first input coupled to an output of the MASH converter and a second input coupled to an output of the programmable delay circuit.

20 Claims, 6 Drawing Sheets

US 10,348,310 B1

PROGRAMMABLE DIGITAL SIGMA DELTA MODULATOR

TECHNICAL FIELD

Examples of the present disclosure generally relate to electronic circuits and, in particular, to a programmable digital sigma delta modulator.

BACKGROUND

Fractional-N phase-locked loop (PLL) circuits are used in many clocking applications due to flexibility in frequency planning. A digital sigma delta modulator (SDM) is one of the main building blocks in a fractional-N PLL. The SDM circuit provides the PLL with the flexibility of having a fractional multiplication factor with the benefit of noise shaping by dithering the divide value of the PLL's feedback dividers. The noise shaping ability of the SDM helps limit the jitter contribution of fractional operation in a fractional-N PLL. Practical SDM architectures, however, suffer from having a limited stable input range. For example, a multi-stage noise shaping (MASH) architecture, which is commonly used in SDMs, has an input range from zero to one. This small input range limits the fractional-N PLL's use in applications such as tracking part-per million (PPM) and spread spectrum clocking (SSC). The limited input range of the SDM prevents its output fractional word from dynamically crossing an integer boundary without causing large jitter in the PLL. Accordingly, it is desirable to provide an SDM circuit having a wider input range.

SUMMARY

Techniques for providing a programmable digital sigma delta modulator (SDM) are described. In an example, a sigma delta modulator (SDM) circuit includes: a floor circuit; a subtractor having a first input coupled an input of the floor circuit and a second input coupled to an output of the floor circuit; a multi-stage noise shaping (MASH) converter having a programmable order, the MASH converter including an input coupled to an output of the subtractor; a programmable delay circuit having an input coupled to the output of the floor circuit; and an adder having a first input coupled to an output of the MASH converter and a second input coupled to an output of the programmable delay circuit.

In another example, a phase-locked loop (PLL) circuit includes: an error detector having a first input to receive a reference frequency and a second input to receive a feedback signal having a feedback frequency; an oscillator having an input coupled to an output of the error detector and an output to provide an output signal having an output frequency, the output frequency being a frequency multiplier times the reference frequency; a frequency divider having an input coupled to the output of the oscillator and an output to provide the feedback signal based on a divider control signal; and a sigma-delta modulator (SDM) having an input to receive a value having a integer portion and a fractional portion and an output to provide the divider control signal. The SDM includes: a floor circuit having an input coupled to the input of the SDM; a subtractor having a first input coupled an input of the floor circuit and a second input coupled to an output of the floor circuit; a multi-stage noise shaping (MASH) converter having a programmable order, the MASH converter including an input coupled to an output of the subtractor; a programmable delay circuit having an input coupled to the output of the floor circuit; and an adder having a first input coupled to an output of the MASH converter, a second input coupled to an output of the programmable delay circuit, and an output coupled to the output of the SDM.

In another example, a method of operating a sigma delta modulator (SDM) circuit includes: receiving an input signal having an integer portion and a fractional portion; processing, at a floor circuit, the input value to generate a floor signal having the integer portion; subtracting, at a subtractor, the floor signal from the input signal to generate a fractional signal having the fractional portion; coupling the fractional signal to a multi-stage noise shaping (MASH) converter having a programmable order; delaying, at a delay circuit, the floor signal using a programmable delay to generate a delayed floor signal; and adding an output signal of the MASH converter and the delayed floor signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
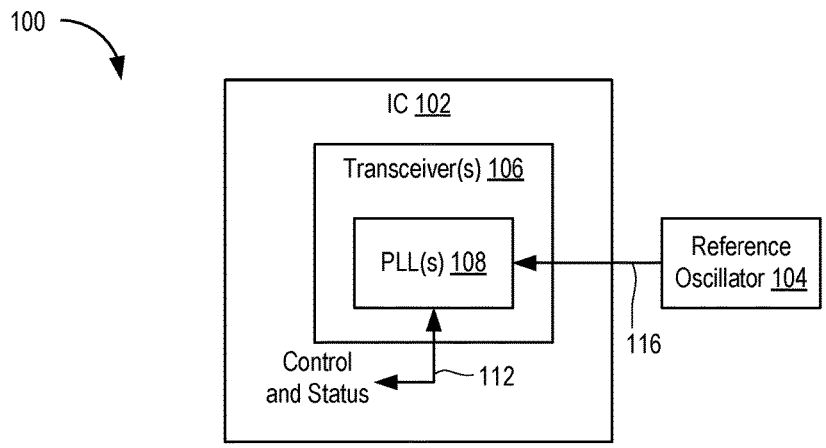
FIG. 1 is a block diagram depicting an example integrated circuit (IC) system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a programmable digital sigma delta modulator (SDM) are described. The techniques described herein solve the problem of a limited input-range of a sigma delta modulator (DSM). The SDM described herein provides a programmable large-input range with a programmable order that can be used in many clocking and timing applications, including tracking parts per million (PPM) and spread spectrum clocking (SSC) utilizing fractional-N phase locked loops (PLLs). In an example, an SDM includes a floor circuit, a subtractor having a first input coupled an input of the floor circuit and a second input coupled to an output of the floor circuit, and a multi-stage noise shaping (MASH) converter having a programmable order. The MASH converter includes an input coupled to an output of the subtractor. The SDM further includes a programmable delay circuit having an input coupled to the output of the floor circuit, and an adder having a first input coupled to an output of the MASH converter and a second input coupled to an output of the programmable delay circuit. These and further aspects are described below with respect to the drawings.

FIG. 1 is a block diagram depicting an example integrated circuit (IC) system 100. The IC system 100 includes an IC 102 coupled to a reference oscillator 104. The IC 102 can be a programmable IC, such as a field programmable gate array (FPGA), complex programmable logic device (CPLD), or the like. Alternatively, the IC 102 can be a mask-defined IC, such an application specific integrated circuit (IC), application specific standard product (ASSP), or the like. The reference oscillator 104 can be a crystal oscillator or the like operable to output a reference signal having a reference frequency. Although a single reference oscillator 104 is shown, the IC 102 can be coupled to a plurality of reference oscillators 104.

The IC 102 includes one or more transceivers 106, which include one or more PLLs 108. An input 116 of the PLL 108 is coupled to receive a reference signal from the reference oscillator 104. An input/output (IO) interface 112 of the PLL 108 is coupled to receive control signal(s) and provide status signal(s). Each of the PLL(s) 108 is coupled to provide an output signal having an output frequency to the transceiver(s) 106. The transceiver(s) 106 can use the output signal to send and/or receive data. An example of a PLL 108 is described below with respect to FIG. 2. In some examples, the IC 102 can include a plurality of PLLs 108, each outputting a different output frequency based on the single reference oscillator 104.

Figure 2:
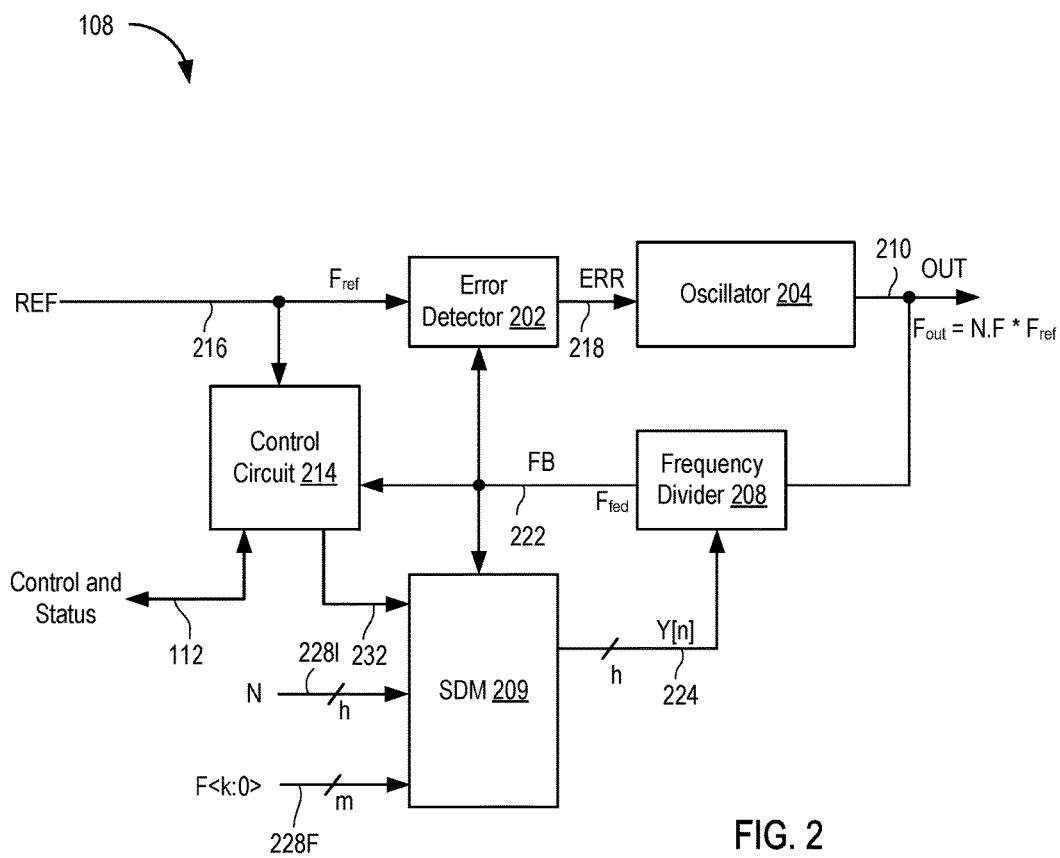
FIG. 2 is a block diagram depicting an example of a phase-locked loop (PLL) circuit according to an example.

FIG. 2 is a block diagram depicting an example of a PLL 108. The PLL 108 includes an error detector 202, an oscillator 204, a frequency divider 208, a sigma-delta modulator (SDM) 209, and a control circuit 214. An input 216 of the error detector 202 is coupled to receive a reference signal (REF) having a reference frequency ($F_{ref}$). For example, the error detector 202 can receive the reference signal REF from the reference oscillator 104. In another example, the reference signal REF can be derived from the reference signal output by the reference oscillator 104 (e.g., the reference signal output by the reference oscillator 104 can be multiplied or divided by an integer to generate the reference signal REF). The error detector 202 also receives a feedback signal (FB) having a frequency $F_{fed}$. The error detector 202 compares the reference frequency $F_{ref}$ and the feedback frequency $F_{fed}$ to generate an error signal (ERR) on an output 218.

An input of the oscillator 204 is coupled to the output 218 of the error detector 202. The oscillator 204 uses the error signal ERR to adjust the frequency of its oscillation. The oscillator 204 includes an output 210 coupled to provide an output signal (OUT) having a frequency $F_{out}$. For example, the output 210 can be the output of the PLL 108. Alternatively, the output 210 can be coupled to the output of the PLL 108 through one or more circuits (now shown). As described herein, the PLL 108 is structured such that the frequency $F_{out}$ is equal to N·F*$F_{ref}$, where "N" is an integer portion and "·F" is a fractional portion of a frequency multiplier "N·F". Stated differently, the ratio of the output frequency $F_{out}$ and the reference frequency $F_{ref}$ is equal to N·F. The oscillator 204 can include one or more voltage controlled oscillators (VCOs) or the like. In an example, each of the VCO(s) includes inductor-capacitor (LC)-based oscillator having a voltage-adjustable capacitance (e.g., a varactor). Other types of VCO(s) 206 known in the art can be used.

An input of the frequency divider 208 is coupled to the output 210 of the oscillator 204. Another input 224 of the frequency divider 208 is coupled to receive a divider control signal (Y[n]) from the SDM 209. The divider control signal (Y[n]) provides a divisor for the frequency divider 208 to use in dividing the frequency of the output signal. The divisor is dithered by the SDM 209 such that the divisor effectively becomes "N·F". The frequency divider 208 includes an output 222 that provides the feedback signal FB having the feedback frequency $F_{fed}$. The feedback frequency $F_{fed}$ effectively equals $F_{out}$/N·F.

The SDM 209 includes an input 228I coupled to receive an input signal N, and an input 228F coupled to receive an input signal F<k:0>. In the example, the input 228I is an h-bit input and the input 228F comprises an m-bit input, where m is a positive integer. The signal N provides an h-bit value representing an integer portion of the frequency multiplier. In one example, h=8, but h can be more or less than eight. The signal F<k:0> provides a value that dictates the fractional portion ·F of the frequency multiplier, where k is less than m. In particular, the fractional portion of the frequency multiplier "·F" equals F<k:0>/2^k. In an example, the value k can be dynamically selected from a plurality of different widths. For example, if m=24 bits, then k can be selected to have a width of 12-bits, 16-bits, 20-bits, or 24-bits. The maximum width m can have other values greater than or less than 24 and the selectable widths k can be other than 12, 16, 20, and 24. In this manner, the number of significant digits for the fractional portion "·F" of the frequency multiplier, and hence the PPM accuracy of the PLL 108, can be increased or decreased by selecting a different width for values F<k:0>.

The SDM 209 includes an input coupled to receive the feedback signal FB from the output 222 of the frequency divider 208. In an example, the SDM 209 can also include an input coupled to receive the reference signal REF. The SDM 209 uses the feedback signal FB as a clock signal to produce different values Y[n] for each cycle of the feedback signal. The value of Y[n] varies between N−O to N+O+1, where O is the selected order (e.g., O=1, 2, or 3 for first, second, or third order, respectively) and N is the integer value on the input 228. The SDM 209 operates such that the average value of Y[n] is equal to N+F<k:0>/2^k. The frequency divider 208 uses the different values of Y[n] as divisors to divide the frequency $F_{out}$ of the output signal OUT and produce a frequency $F_{fed}$ of the feedback signal FB. In this manner, the frequency $F_{out}$ of the output signal OUT is effectively divided by N·F. An example of the SDM 209 is described below with respect to FIG. 3.

The control circuit 214 includes an input coupled to the output 222 of the frequency divider 208 to receive the feedback signal FB. The control circuit 214 includes another input coupled to receive the reference signal REF. The control circuit 214 is coupled to the IO interface 112 to receive control signal(s) and provide status signal(s) for the PLL 108. The control circuit 214 includes an output coupled to an input 232 of the SDM 209.

The SDM 209 can include a plurality of stages. In an example, each the stages is itself a first-order SDM. The SDM stages can be cascaded to realize a multi-stage noise shaping (MASH) structure having a programmable order. The SDM 209 includes an input 232 coupled to receive control signals from the control circuit 214. The SDM 209 selects an order based on a control signal from the control circuit 214. For example, the SDM 209 can include three stages and can select from a first order (1), a second order (1-1), and a third order (1-1-1). The SDM 209 can include other numbers of stages greater than or less than three and thus can have different numbers of selectable orders. The SDM outputs a value Y[n] for each cycle n of the feedback signal. In the present example, the value Y[n] includes h-bits. In an example, h=8 bits, but the output value Y[n] of the SDM 209 can have more or less than 8-bits.

Figure 3:
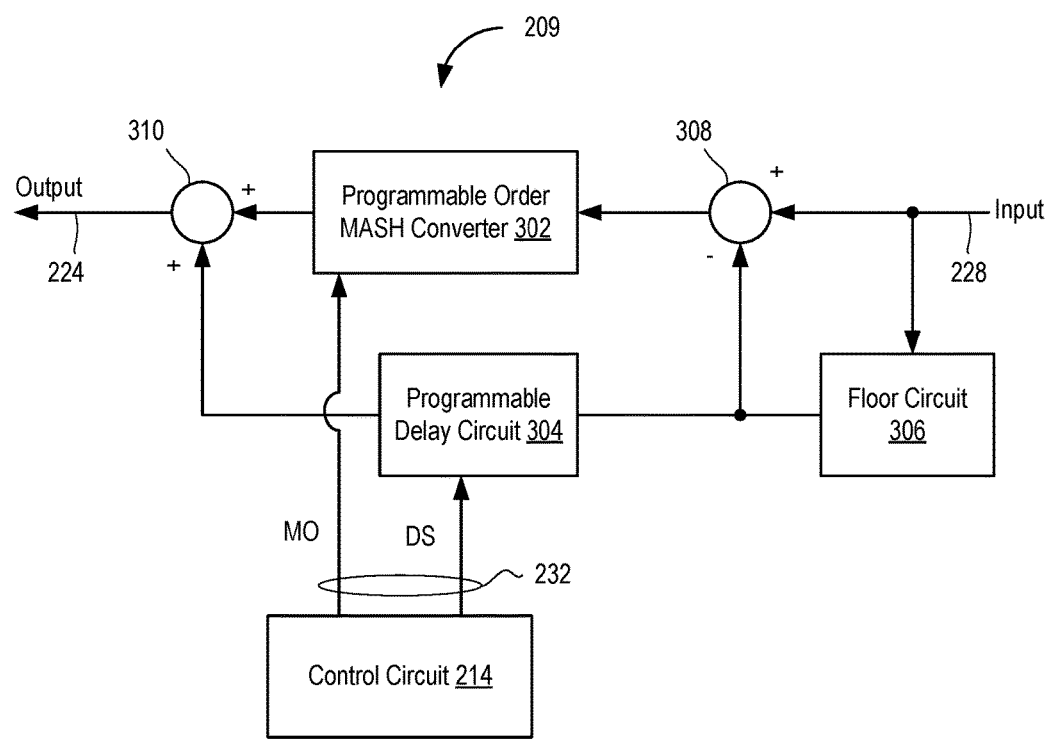
FIG. 3 is a block diagram depicting a sigma delta modulator (SDM) according to an example.

FIG. 3 is a block diagram depicting the SDM 209 according to an example. The SDM 209 includes a programmable order MASH converter 302, a programmable delay circuit 304, a floor circuit 306, a subtractor 308, and an adder 310. An input of the floor circuit 306 is coupled to the input 228. An output of the floor circuit 306 is coupled to an input of the subtractor 308 and an input of the programmable delay circuit 304. Another input of the subtractor 308 is coupled to the input 228. An output of the subtractor 308 is coupled to an input of the programmable order MASH converter 302. An output of the programmable order MASH converter 302 is coupled to an input of the adder 310. An output of the programmable delay circuit 304 is coupled to another input of the adder 310. An output of the adder 310 is coupled to the output 224. The control circuit 214 provides a control signal MO to the programmable order MASH converter 302 to select the order thereof. The control circuit 214 provides a control signal DS to the programmable delay circuit 304 to set the delay thereof.

Due to the limited input range of the programmable order MASH converter 302, the SDM 209 first floors the input to obtain the integer portion of the input 228. The integer portion passes through the programmable delay circuit 304. In contrast, the programmable order MASH converter 302 processes the difference between the wide range input and the integer portion output by the floor circuit 306 (i.e., the fractional portion of the input 228). The control circuit 214 sets the delay of the delay circuit 304 to match the signal transfer function of the programmable order MASH converter 302. The programmable order MASH converter 302 provides flexibility in the noise shaping to support different applications. The integer portion of the input 228 passes through a programmable delay rather than a fixed delay because the different orders of the programmable order MASH converter 302 have different signal transfer functions that should be matched. At the output, the delayed integer portion is added to the output of the programmable order MASH converter 302 to produce the final output 224. In the architecture of FIG. 3, the SDM operates properly regardless of the order of the programmable order MASH converter 302 and regardless of the range of the input 228. That is, the SDM 209 allows for an unlimited input range of the input 228; provides a programmable order to allow for noise shaping that adapts to the particular application; provides the ability for the divider input to dynamically cross the integer boundary when used in a fractional-N PLL; provides unlimited spread spectrum range when used in spread spectrum (SSC) applications; and provides delay matching to avoid an increase in output jitter and ensure smooth and accurate output.

Figure 4:
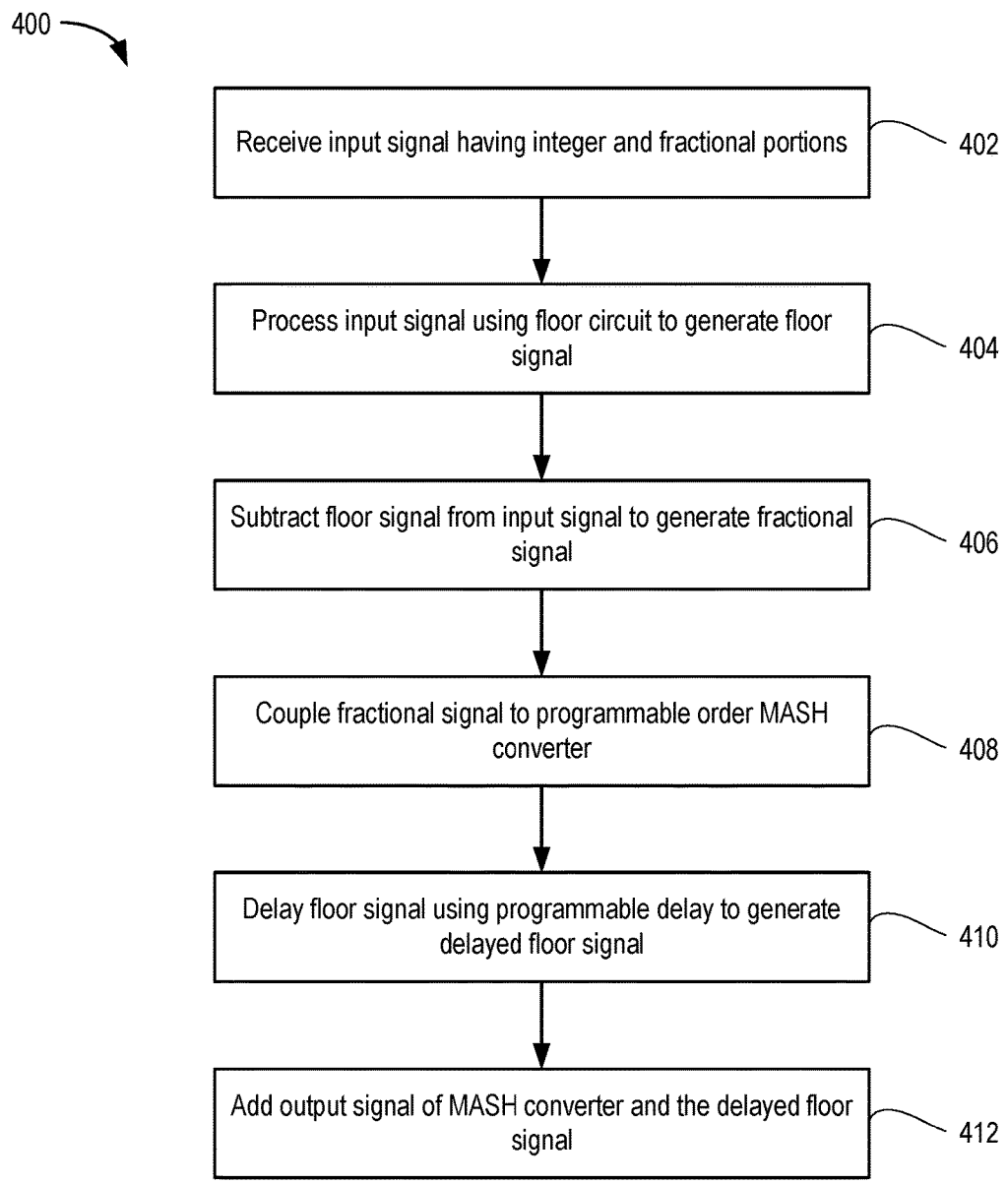
FIG. 4 is a flow diagram depicting a method of operating an SDM according to an example.

FIG. 4 is a flow diagram depicting a method 400 of operating an SDM 209 according to an example. The method 400 begins at step 402, where the SDM 209 receives an input signal having integer and fractional portions. At step 404, the floor circuit 306 processes the input signal to generate a floor signal having the integer portion. At step 406, the subtractor 308 determines the difference between the floor signal and the input signal to generate a fractional signal having the fractional portion of the input. At step 408, the fractional signal is coupled to the programmable order MASH converter 302. At step 410, the floor signal is delayed by the delay circuit 304 to generate a delayed floor signal. At step 412, the adder 310 adds the output of the programmable order MASH converter 302 and the delayed floor signal to generate the output of the SDM 209.

Figure 5:
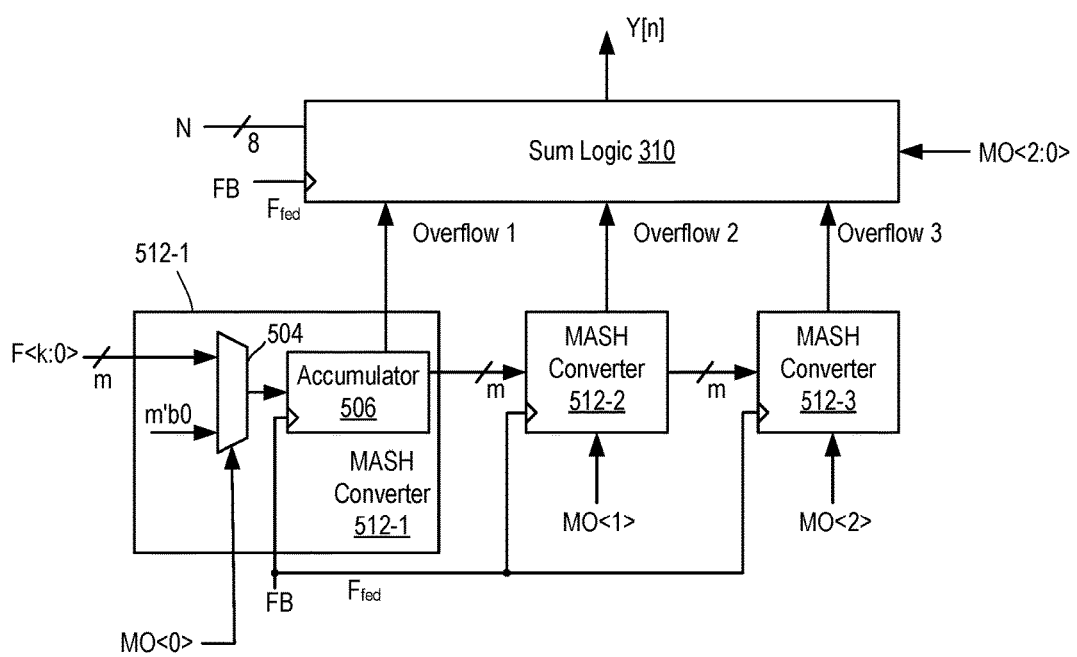
FIG. 5 is a block diagram depicting an example of a programmable order MASH converter according to an example.

FIG. 5 is a block diagram depicting an example of the programmable order MASH converter 302 according to an example. In the example, the programmable order MASH converter 302 includes three MASH converters 512-1 through 512-3. An input of the MASH converter 512-1 is coupled to receive the signal F<k:0>. An output of the MASH converter 512-1 is coupled to an input of the MASH converter 512-2. An output of the MASH converter 512-2 is coupled to an input of the MASH converter 512-3. Clock inputs of the MASH converters 512-1 through 512-3 are coupled to receive the feedback signal FB.

Each of the MASH converters 512-1 through 512-3 includes a multiplexer 504 and an accumulator 506. For clarity, only the MASH converter 512-1 is shown in detail. It is to be understood that the MASH converters 512-2 and 512-3 are configured similarly to the MASH converter 512-1. Inputs of the multiplexer 504 are coupled to receive a value to be accumulated (e.g., F<k:0> or an accumulator output from a prior stage) and a logic zero signal (m'b0). An output of the multiplexer 504 is coupled to an input of the accumulator 506. One output of the accumulator 506 provides the accumulated value, and another output of the accumulator 506 provides a carry bit (overflow bit). A clock input of the accumulator 506 is coupled to receive the feedback signal FB. One control input of the multiplexer 504 is coupled to receive a bit of the order select signal MO. The bits M<2:0> of the order select signal MO determine which of the MASH converters 512-1 through 512-3 are enabled (e.g., the order of the programmable order MASH converter 302).

Assume the programmable order MASH converter 302 is configured in the third (1-1-1) order. The MASH converter 512-1 adds the value F<k:0> to its accumulated value for each cycle of the feedback signal FB. The MASH converter 512-2 adds the accumulated value of the MASH converter 512-1 to its accumulated value for each cycle of the feedback signal FB. The MASH converter 512-3 adds the accumulated value of the MASH converter 512-2 to its accumulated value for each cycle of the feedback signal FB. The carry (overflow) bits of the MASH converters 512-1 through 512-3 are coupled to inputs of the adder 310 (designated overflow 1, overflow 2, and overflow 3). If any of the MASH converters 512-1 through 512-3 are disabled by the order select signal MO, then the respective carry (overflow) bits are zero.

The adder 310 has a clock input coupled to receive the feedback signal FB, an input to receive the integer value N, and an input coupled to receive the mash order signal (MO<2:0>). An output of the adder 310 provides the divider control signal Y[n]. The adder 310 combines the values of the overflows with the integer value N to generate the output value Y[n] for each cycle of the feedback signal FB. The MASH order signal MO<2:0> determines the number of the MASH converters 512-1 through 512-3 used in the computation. For a first order computation, only the overflow 1 from the MASH converter 512-1 is used. For a second order computation, only the overflow 1 and overflow 2 from the MASH converters 512-1 and 512-2, respectively, are used. For a third order computation, all overflows 1, 2, and 3 are used. The value of Y[n] varies between N−O to N+O+1, where O is the selected order (e.g., O=1, 2, or 3 for first, second, or third order, respectively).

Figure 6:
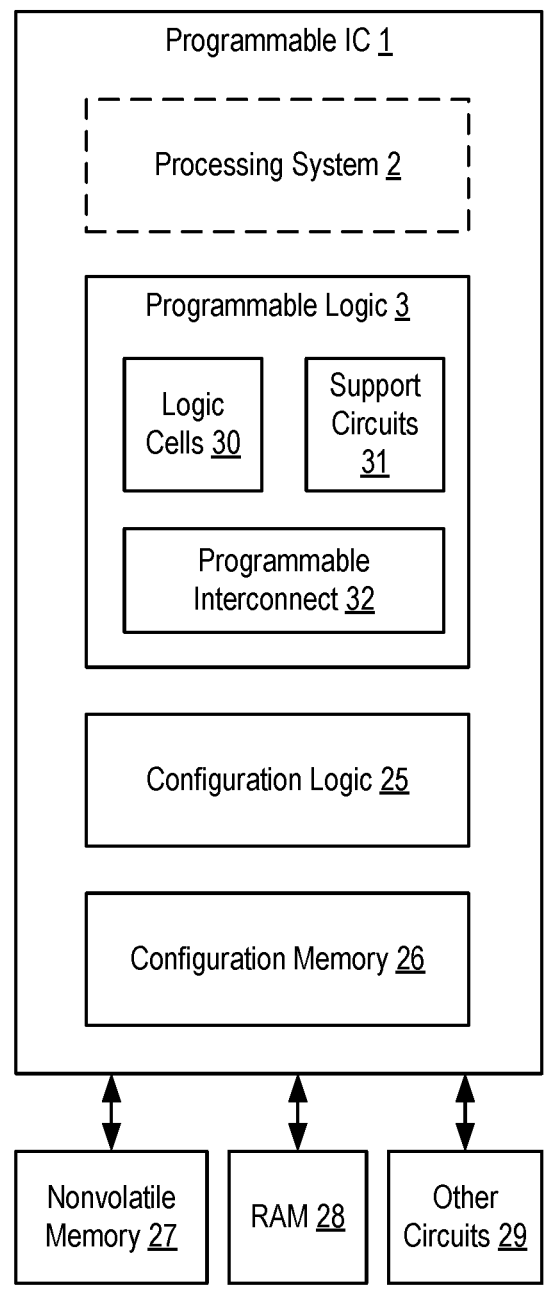
FIG. 6 is a block diagram depicting a programmable IC according to an example.

FIG. 6 is a block diagram depicting a programmable IC 1 according to an example that can be used as an implementation of the IC 102 shown in FIG. 1. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 7:
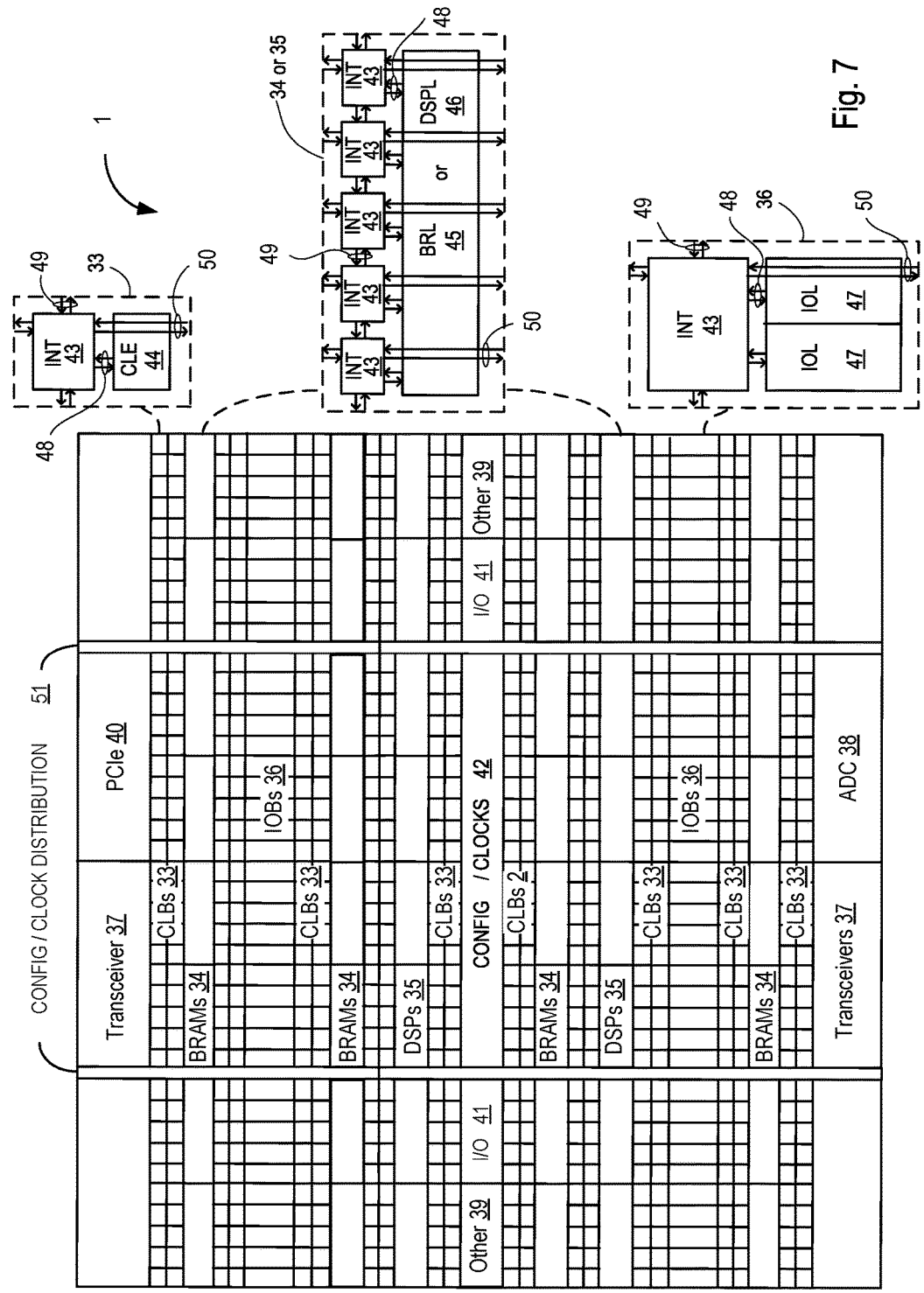
FIG. 7 illustrates a field programmable gate array (FPGA) implementation of the programmable IC of FIG. 6 according to an example.

FIG. 7 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 7. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 7) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A sigma delta modulator (SDM) circuit, comprising:
   a floor circuit;
   a subtractor having a first input coupled an input of the floor circuit and a second input coupled to an output of the floor circuit;
   a multi-stage noise shaping (MASH) converter having a programmable order, the MASH converter including an input coupled to an output of the subtractor;

a programmable delay circuit having an input coupled to the output of the floor circuit; and an adder having a first input coupled to an output of the MASH converter and a second input coupled to an output of the programmable delay circuit.

2. The SDM circuit of claim 1, further comprising:

a control circuit coupled to the MASH converter and the programmable delay, the control circuit configured to control the programmable order of the MASH converter and a programmable delay of the programmable delay circuit.

3. The SDM circuit of claim 2, wherein the control circuit is configured to set the programmable delay to match a transfer function of the MASH converter based on a setting of the programmable order of the MASH converter.

4. The SDM circuit of claim 2, wherein the MASH converter comprises a plurality of cascaded stages, where an input stage is coupled to receive the input of the subtractor and where each of the plurality of stages includes an enable input coupled to the control circuit, and wherein the control circuit is configured to control the programmable order of the MASH converter by enabling a selected number of the plurality of cascaded stages.

5. The SDM circuit of claim 4, wherein the output of the MASH converter is configured to provide a value derived from output of the selected number of the plurality of cascaded stages.

6. The SDM circuit of claim 1, wherein the input of the floor circuit is configured to receive a digital signal representing a value having an integer portion and a fractional portion, and wherein the floor circuit is configured to output the integer portion of the value.

7. The SDM circuit of claim 6, wherein the subtractor is configured to subtract the input of the floor circuit from the output of the floor circuit to provide the fractional portion of the value to the MASH converter.

8. A phase-locked loop (PLL) circuit, comprising:

an error detector having a first input to receive a reference frequency and a second input to receive a feedback signal having a feedback frequency;

an oscillator having an input coupled to an output of the error detector and an output to provide an output signal having an output frequency, the output frequency being a frequency multiplier times the reference frequency;

a frequency divider having an input coupled to the output of the oscillator and an output to provide the feedback signal based on a divider control signal;

a sigma-delta modulator (SDM) having an input to receive a value having a integer portion and a fractional portion and an output to provide the divider control signal, the SDM including:

a floor circuit having an input coupled to the input of the SDM;

a subtractor having a first input coupled an input of the floor circuit and a second input coupled to an output of the floor circuit;

a multi-stage noise shaping (MASH) converter having a programmable order, the MASH converter including an input coupled to an output of the subtractor;

a programmable delay circuit having an input coupled to the output of the floor circuit; and an adder having a first input coupled to an output of the MASH converter, a second input coupled to an output of the programmable delay circuit, and an output coupled to the output of the SDM.

9. The PLL circuit of claim 8, wherein the SDM further comprises:

a control circuit coupled to the MASH converter and the programmable delay, the control circuit configured to control the programmable order of the MASH converter and a programmable delay of the programmable delay circuit.

10. The PLL circuit of claim 9, wherein the control circuit is configured to set the programmable delay to match a transfer function of the MASH converter based on a setting of the programmable order of the MASH converter.

11. The PLL circuit of claim 9, wherein the MASH converter comprises a plurality of cascaded stages, where an input stage is coupled to receive the input of the subtractor and where each of the plurality of stages includes an enable input coupled to the control circuit, and wherein the control circuit is configured to control the programmable order of the MASH converter by enabling a selected number of the plurality of cascaded stages.

12. The PLL circuit of claim 11, wherein the output of the MASH converter is configured to provide a value derived from output of the selected number of the plurality of cascaded stages.

13. The PLL circuit of claim 8, wherein the input of the floor circuit is configured to receive a digital signal representing a value having an integer portion and a fractional portion, and wherein the floor circuit is configured to output the integer portion of the value.

14. The PLL circuit of claim 13, wherein the subtractor is configured to subtract the input of the floor circuit from the output of the floor circuit to provide the fractional portion of the value to the MASH converter.

15. A method of operating a sigma delta modulator (SDM) circuit, comprising:

receiving an input signal having an integer portion and a fractional portion;

processing, at a floor circuit, the input value to generate a floor signal having the integer portion;

subtracting, at a subtractor, the floor signal from the input signal to generate a fractional signal having the fractional portion;

coupling the fractional signal to a multi-stage noise shaping (MASH) converter having a programmable order;

delaying, at a delay circuit, the floor signal using a programmable delay to generate a delayed floor signal; and adding an output signal of the MASH converter and the delayed floor signal.

16. The method of claim 15, further comprising:

controlling, at a control circuit, the programmable order of the MASH converter and the programmable delay of the delay circuit.

17. The method of claim 16, wherein the step of controlling comprises setting the programmable order of the MASH converter and setting the programmable delay to match a transfer function of the MASH converter.

18. The method of claim 16, wherein the MASH converter comprises a plurality of cascaded stages and wherein the step of controlling comprises enabling a selected number of the plurality of cascaded stages.

19. The method of claim 18, wherein the output of the MASH converter is configured to provide a value derived from output of the selected number of the plurality of cascaded stages.

20. The method of claim 15, further comprising:

providing an output of the adder to a fractional-N phase-locked loop (PLL) circuit.

* * * * *